United States Patent [19]
Park

[11] Patent Number: 5,297,100
[45] Date of Patent: Mar. 22, 1994

[54] ADDRESS CONTROL SYSTEM FOR A RAM IN A DIGITAL AUDIO SET

[75] Inventor: Byung-Chull Park, Buchon-city, Rep. of Korea

[73] Assignee: SamSung Electronics Co., Ltd., Suwon, Rep. of Korea

[21] Appl. No.: 866,858

[22] Filed: Apr. 10, 1992

[30] Foreign Application Priority Data

Sep. 28, 1991 [KR] Rep. of Korea ............ 91-16964

[51] Int. Cl.$^5$ ............................................. G11C 8/00
[52] U.S. Cl. ........................... 365/230.01; 365/194; 365/230.02; 365/230.06; 365/236
[58] Field of Search ............. 365/230.01, 236, 230.02, 365/230.06, 230.08, 193, 194

[56] References Cited

U.S. PATENT DOCUMENTS

| | | | |
|---|---|---|---|
| 4,506,348 | 3/1985 | Miller et al. | 365/230.02 |
| 4,813,014 | 3/1989 | DeBell | 365/45 |
| 5,173,878 | 12/1993 | Sakui et al. | 365/193 |

FOREIGN PATENT DOCUMENTS 0058206 4/1982 Japan ................... 365/236

Primary Examiner—Eugene R. LaRoche
Assistant Examiner—Son Dinh
Attorney, Agent, or Firm—Bushnell, Robert E.

[57] ABSTRACT

An address control system for a RAM, comprising a synchronous counter for receiving input data according to a clock signal and providing n-bit row column address, and an n-bit column address a first buffer for receiving the n-bit row address from the synchronous counter and generating the n-bit row address, a first tri-state inverter for outputting data stored in a ROM according to a write enable signal a second tri-state inverter for outputting reference data according to the write enable signal, an adder for adding the n-bit column address from the synchronous counter and output address signals from the first inverter, and a second buffer for receiving output signals from the adder generating a column address delayed from the n-bit column address.

15 Claims, 2 Drawing Sheets

ADDRESS CONTROL SYSTEM FOR A RAM IN A DIGITAL AUDIO SET

BACKGROUND OF THE INVENTION

The present invention relates to an address control system for a Random Access Memory (RAM) in a digital audio system, and more particularly to an address control system in a digital audio system capable of performing a pre-set function in order to efficiently use the RAM.

In a surround audio or sound field reproduction system, in general, since every sound emitted through a speaker is echoed with small or large time lags, causing time lagged sound to be heard, it is necessary for the system to employ a time delay processor to provide the central handling of the surround type. A much longer delayed time lag may be considered as a reproduction of large and wide echo circumstances but it becomes difficult to control the delayed time lag.

SUMMARY OF THE INVENTION

Accordingly, an object of the present invention is to provide an address control system for a RAM which can estimate a constant delayed time by means of controlling the read/write addresses of the RAM and concretely defining the delay time with a constant time lag within the error range of 1 msec.

to achieve the stated object and other benefits of the present invention, a digital surround processor according to the present invention comprises a 16-bit synchronous counter, an 8-bit parallel adder, a pair of 8 bit tri-state buffers and a pair of 8-bit inverters tri-state, in order to achieve the efficient delay function of a digital signal.

DETAILED DESCRIPTION OF THE INVENTION

Figure 1:
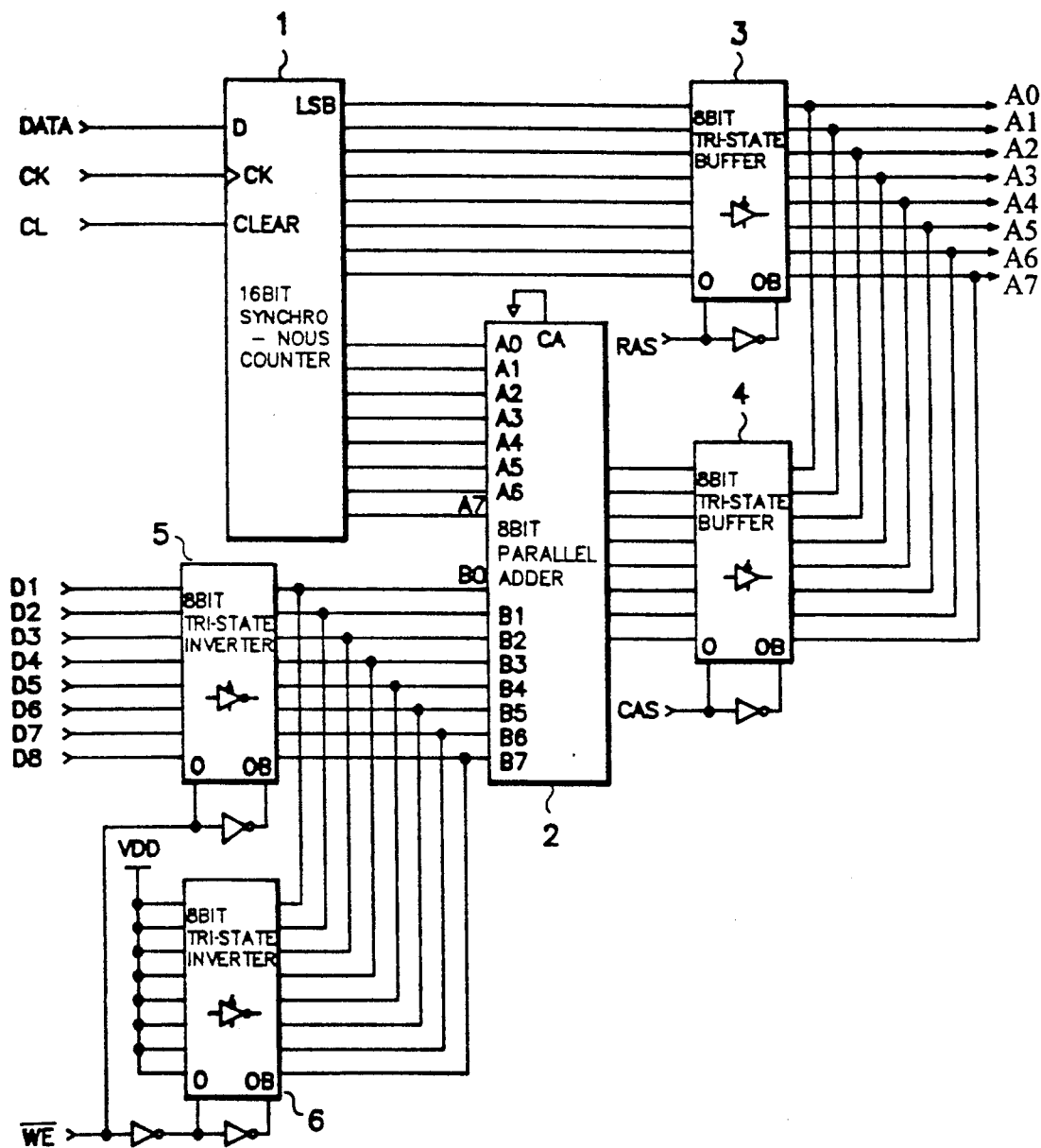
FIG. 1 is a block diagram illustrating an address control system for a RAM according to the present invention.

Above-mentioned and other features and objects of the present invention will become more apparent by reference to the following description taken in conjunction with the accompanying drawings. Note that the disclosed embodiment is adopted to a 4×64 RAM in accordance with 16-bit parallel data in an address control system for a RAM according to the present invention illustrated in FIG. 1.

The lower eight bits of a 16-bit synchronous counter 1 controlled by a clock signal provide a row address and the upper eight bits provide a column address. Thus, the lower eight bits are applied to a first 8-bit tri-state buffer 3 and the upper eight bits to an 8-bit parallel adder 2. Among the eight bits applied to the first 8-bit tri-state buffer 3, a lower two bits divide 16-bit data into four portions of four bits. A first 8-bit tri-state inverter 5 receives 8-bit data D0–D7 belonging to a Read Only Memory (ROM)(not shown) is controlled by a write enable signal $\overline{WE}$, as is a second 8-bit tri-state inverter 6. In the write mode, that is, when the write enable signal $\overline{WE}$ shifts to "low" state, the second 8-bit tri-state inverter 6, wherein the terminals 0 and 0B are respectively at the states of "high" and "low", generates output data "0000 0000".

At this time, the data D0–D7 connected to the first 8-bit tri-state inverter 5 can not be applied to the adder 2 because the output data from the second 8-bit tri-state inverter 6 are being transferred through the common lines to the adder 2. Only alternate data access from the two inverters 5, 6 to the adder 2 is possible.

Therefore, the column addresses A0–A7 supplied from the 16-bit synchronous counter 1 are applied to the second 8-bit tri-state buffer 4 through the 8-bit parallel adder 2.

The outputs of the second 8-bit tri-state buffer 4 and the first 8-bit tri-state buffer 3 are respectively controlled by a column address strobe signal CAS and a row address strobe signal RAS.

On the other hand, in a read mode of "high" state of the $\overline{WE}$, the terminals 0 and 0B of the second 8-bit tri-state inverter 6 are respectively at the states of "low" and "high", so that the second 8-bit tri-state inverter 6 is turned off.

At this time, the terminals 0 and 0B of first 8-bit tri-state inverter 5 are respectively at the states of "high" and "low" so that the received data D0–07 from a ROM can be applied to the terminals B0–B7 of the adder 2.

At this time, the lower eight bits from the counter 1 are applied to the first buffer 3. The upper eight bits are applied to the terminals A0–A7 of the adder 2 and added to the value of the data applied to the terminals B0–B7. The added data of eight bits are applied to the second 8-bit tri-state buffer 4.

This signal is a read address containing a time lag by the date D0–D7 delayed from a write address in the read mode. Thus, in the case of reading and writing data in a sampling period, a row address for writing is the same as that for reading and a column address for reading is delayed by the value D0–D7 from the column address for writing in the write mode.

The column address applied to the second 8-bit tri-state buffer 4 is applied the RAM as a resultant address A0–A7.

The time value of the column address in the read mode delayed from the column address in the write mode is as shown in the following equations, revealing how the delayed time can be adjusted;

$$\text{(the value of one delay time)} = 32/\text{(the value of the internal sampling frequency)} \quad (1),$$

$$\text{(the value of overall delay time)} = \text{(the value of one delay time)} \times \text{(the number of steps)} \quad (2),$$

Where the number of steps means a decimal value in accordance with the data D0–D7 and the value 32 consists of 16 bits settled in each of the left and right channels.

Assuming that the internal sampling frequency is 44.1 KHz and the data D0–D7 are 01011010, the one delay time becomes about 0.73 ms and the overall delay time about 65.3 ms.

Figure 2:
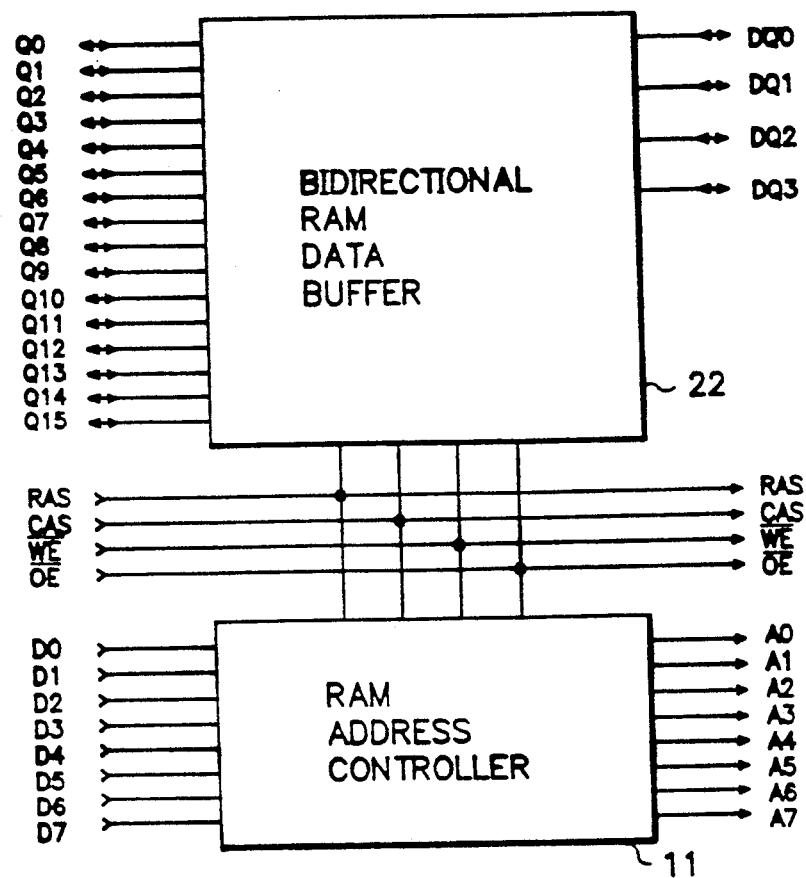
FIG. 2 is a functional block diagram that illustrates the interfacing operation between a RAM and the address control system of the present invention.

Referring to FIG. 2, the random address controller 11 according to the present invention is capable of controlling the address of the bidirectional RAM data buffer which reads out and writes 16-bit data by four bits in a RAM.

The address and data are transferred by the control signals RAS, CAS, $\overline{WE}$ and $\overline{OE}$.

Herein, data are divided into four portions by means of a lower two bits in the row address and each of the four portions is read from and written in the RAM during a sampling period. Namely, the lower two bits from the counter have the data be changed, the values being 00,01,10 and 11.

Figure 3:
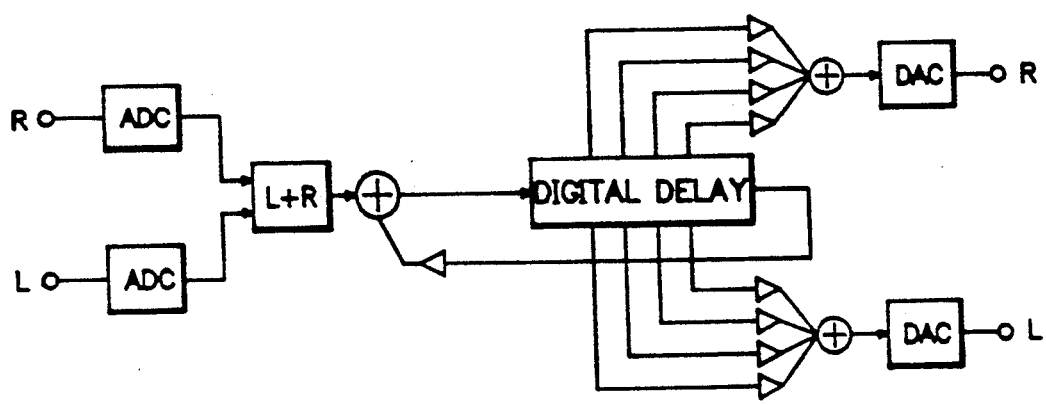
FIG. 3 is an embodiment of an echo system utilizing the present address control system.

FIG. 3 shows digital echo features according to the present invention. The echo effect can be fully accomplished by adjusting the calculated value of the delay time.

As described above, the present invention is capable of controlling the delay time only be means of the external setting operation for the delay time and minimizing the chip size by simplifying the architecture of the internal logic circuit.

Furthermore, as the column address can always be estimated in the full adder, the timing of the set operation for the delay time may be free from any restriction.

It will be appreciated that the present invention is not restricted to the particular embodiment that has been described and illustrated, and that variations may be made therein without departing from the scope of the invention.

What is claimed is:

1. An address control system for a random access memory, comprising:
    a synchronous counter for receiving input data according to a clock signal and providing an n-bit row address and an n-bit column address;
    a first tri-state buffer for providing said n-bit row address in dependence upon said n-bit row address received from said synchronous counter;
    a first tri-state inverter for receiving and inverting delay data stored in a read only memory according to a write enable signal to generate inverted data;
    a second tri-state inverter for receiving and inverting reference voltage data according to said write enable signal;
    an adder for adding said n-bit column address from said synchronous counter and said inverted data from said first tri-state inverter to generate an added signal; and
    a second tri-state buffer for receiving said added signal from said adder and generating a delayed column address delayed by an amount of time based on said delay data.

2. An address control system for controlling and delaying a read address and a write address of a random access memory, said address control system comprising:
    synchronous counting means for generating a row address and a column address in response to a clock signal;
    first tri-state inverting means for receiving and inverting delay data in response to a write enable signal to generate first inverted data on a first plurality of output lines;
    second tri-state inverting means for receiving and inverting a reference voltage in response to said write enable signal to generate second inverted data on said first plurality of output lines;
    adding means for adding said column address to said first inverted data to generate an added signal;
    first tri-state buffer means for storing and transmitting said row address on a second plurality of output lines in response to a row address strobe signal; and
    second tri-state buffer means for storing said added signal and transmitting said added signal on said second plurality of output lines in response to a column address strobe signal.

3. The address control system as claimed in claim 2, wherein said first plurality of output lines transmits said first inverted data when said write enable signal is in a first state and said first plurality of output lines transmits said second inverted data when said write enable signal is in a second state.

4. The address control system as claimed in claim 3, wherein said second plurality of output lines transmits said row address when said row address strobe signal is in a given row address strobe state and said second plurality of output lines transmits said added signal when said column address strobe signal is in a given column address strobe state.

5. The address control system as claimed in claim 4, wherein a plurality of bits of said row address divides information into a plurality of portions equal in number to said plurality of bits, wherein each one of said plurality of portions is written into the random access memory and read from the random access memory during a sampling period.

6. An address control system for controlling and delaying read addresses and write addresses of a random access memory in a digital audio system, said address control system comprising:
    counting means for generating a row address and a column address in response to a clock signal;
    means for alternately enabling transmission of one of delay data and reference voltage data in response to a write enable signal to generate a time lag signal;
    adding means for adding said column address to said time lag signal to generate an added signal; and
    means for alternately enabling transmission of one of said row address and said added signal in response to a column address strobe signal and a row address strobe signal.

7. The address control system as claimed in claim 6, wherein said means for alternately enabling transmission of one of delay data and reference voltage data comprises:
    first tri-state inverting means for inverting and enabling transmission of said delay data when said write enable signal is in a first state to generate said time lag signal; and
    second tri-state inverting means for inverting and enabling transmission of said reference voltage data when said write enable signal is in a second state to generate said time lag signal.

8. The address control system as claimed in claim 7, wherein said means for alternately enabling transmission of one of said row address and said added signal comprises:
    first tri-state buffer means for storing and enabling transmission of said row address in response to said row address strobe signal; and
    second tri-state buffer means for storing and enabling transmission of said added signal in response to said column address strobe signal.

9. The address control system as claimed in claim 8, wherein said adding means is a parallel adder and said counting means is a synchronous counter.

10. The address control system as claimed in claim 8, wherein a plurality of bits of said row address divides information into a plurality of portions equal in number to said plurality of bits, wherein each one of said plurality of portions is written into the random access memory and read from the random access memory during a sampling period.

11. A method of controlling and delaying a read/write address of a random access memory in a digital audio system, said method comprising:
   generating a row address and a column address in response to a clock signal;
   adding a delay signal to said column address during a read mode of the random access memory to generate a first added signal;
   adding a reference voltage signal to said column address during a write mode of the random access memory to generate a second added signal; and
   generating said read/write address by alternately enabling transmission of said row address and one of said first added signal and said second added signal to the random access memory in response to a row address strobe signal and a column address strobe signal.

12. The method as claimed in claim 11, further comprising:
   converting a left channel analog signal and a right channel analog signal to a first digital signal and a second digital signal, respectively;
   adding said first digital signal and said second digital signal to generate a combined digital signal;
   reading the combined signal from and writing the combined signal to the random access memory according to said read/write address;
   separating a left channel digital signal and a right channel digital signal from said combined digital signal according to said reading of the combined signal from the random access memory; and
   converting said left channel digital signal and said right channel digital signal to a first analog signal and a second analog signal, respectively.

13. The address control system as claimed in claim 1, further comprising:
   analog-to-digital converter means for converting a left channel analog signal and a right channel analog signal respectively into a first digital signal and a second digital signal;
   an adder providing a combined signal by adding said first digital signal and said second digital signal to generate a combined digital signal;
   means for separating a left channel digital signal and a right channel digital signal from said combined digital signal read according to said n-bit row address and said n-bit column address; and
   digital-to-analog converter means for converting said left channel digital signal and said right channel digital signal respectively into a first analog signal and a second analog signal 14. The address control system as claimed in claim 2, further comprising:
   analog-to-digital converter means for converting a left channel analog signal and a right channel analog signal respectively into a first and a second digital signal;
   an adder providing a combined signal by adding said first digital signal and said second digital signal to generate a combined digital signal;
   means for separating a left channel digital signal and a right channel digital signal from said combined digital signal read according to said read address and said write address; and
   digital-to-analog converter means for converting said left channel digital signal and said right channel digital signal respectively into a first analog signal and a second analog signal.

15. The address control system as claimed in claim 6, further comprising:
   analog-to-digital converter means for converting a left channel analog signal and a right channel analog signal respectively into a first digital signal and a second digital signal;
   an adder providing a combined signal by adding said first digital signal and said second digital signal to generate a combined digital signal;
   means for separating a left channel digital signal and a right channel digital signal from said combined digital signal read according to said read addresses and said write addresses; and
   digital-to-analog converter means for converting said left channel digital signal and said right channel digital signal respectively into a first analog signal and a second analog signal.

* * * * *

UNITED STATES PATENT AND TRADEMARK OFFICE
CERTIFICATE OF CORRECTION

PATENT NO. :     5,297,100
DATED      :     March 22, 1994
INVENTOR(S) :    Byung-Chull Park It is certified that error appears in the above-indentified patent and that said Letters Patent is hereby corrected as shown below:

Column 1,    Line 29,    Change "to" to --To-- ;

Column 2,    Line 36,    Change "date" to --data-- ;

Line 43,    After "applied", Insert --to-- ;

Line 56,    Change "Where" to --where-- ;

Column 3,    Line 14,    After "only", Change "be" to --by-- .

Signed and Sealed this

Fourth Day of October, 1994

Attest:

BRUCE LEHMAN

Attesting Officer    Commissioner of Patents and Trademarks